United States Patent
Yamamoto

(10) Patent No.: US 10,284,230 B2
(45) Date of Patent: May 7, 2019

(54) LINKED STORAGE SYSTEM AND HOST SYSTEM ERROR CORRECTING CODE

(71) Applicant: Western Digital Technologies, Inc., Irvine, CA (US)

(72) Inventor: Satoshi Yamamoto, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 15/351,620

(22) Filed: Nov. 15, 2016

(65) Prior Publication Data

US 2018/0137006 A1    May 17, 2018

(51) Int. Cl.
*H03M 13/00* (2006.01)
*H03M 13/29* (2006.01)
*G06F 11/10* (2006.01)

(52) U.S. Cl.
CPC ..... *H03M 13/2906* (2013.01); *G06F 11/1012* (2013.01)

(58) Field of Classification Search
None
See application file for complete search history.

(56) References Cited

U.S. PATENT DOCUMENTS

| | | | | |
|---|---|---|---|---|
| 8,621,317 B1* | 12/2013 | Cypher | ............. | H03M 13/2927 714/755 |
| 9,203,434 B1* | 12/2015 | Garani | ................ | H03M 13/033 |
| 9,214,963 B1* | 12/2015 | Garani | ............... | H03M 13/1102 |
| 9,530,442 B1* | 12/2016 | Hassner | ............... | G06F 11/0727 |
| 2014/0157082 A1* | 6/2014 | Kim | ..................... | G06F 11/1012 714/763 |
| 2014/0223255 A1* | 8/2014 | Lu | ......................... | G06F 11/1068 714/758 |
| 2015/0178161 A1* | 6/2015 | Burd | ................... | G11B 20/1833 714/764 |
| 2016/0350186 A1* | 12/2016 | Blaum | ................ | H03M 13/373 |

* cited by examiner

*Primary Examiner* — Daniel F. McMahon

(57) ABSTRACT

Systems, methods, and software are provided herein for error correction in writing and reading data to and from a data storage device. In one implementation, an encoder matrix is used to generate, for a data set, first error correcting code (ECC) parity data on a host system, and second ECC parity data for tracks on data storage device coupled to the host system. Once generated, the data storage device will store the data set and the first and second ECC parity data on storage media for the device. When a read is required, the storage device will provide a first version of the data set with the first and second ECC parity data to the host system, permitting the host system to use the parity data to generate a corrected version of the data set.

22 Claims, 9 Drawing Sheets

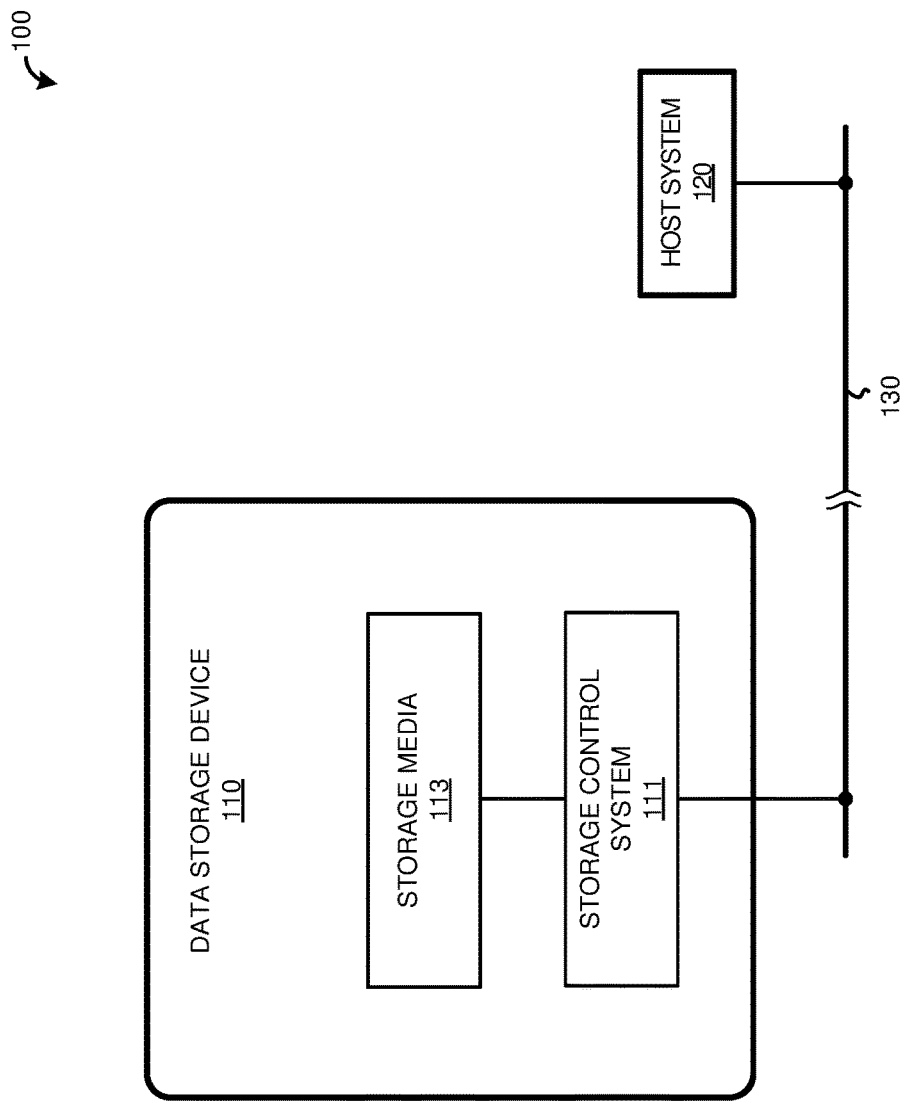

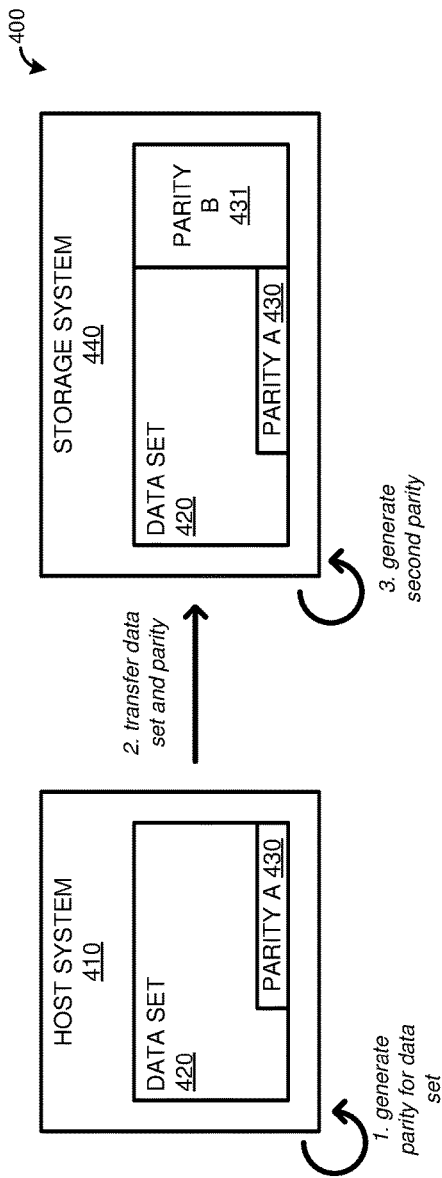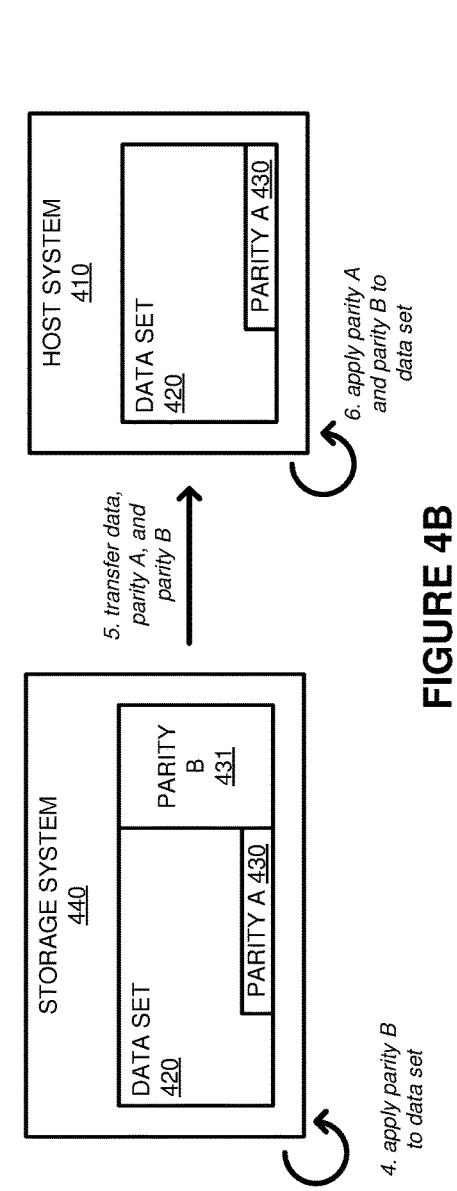

US 10,284,230 B2

LINKED STORAGE SYSTEM AND HOST SYSTEM ERROR CORRECTING CODE

TECHNICAL BACKGROUND

Storage devices, such as hard disk drives and solid state drives, provide storage media for host processing systems to store and read various data objects. These data objects may include images, videos, word documents, spreadsheets, and various other file types capable of being processed by the host processing system. To make storage media available to the host system, one or more of the storage devices may be communicatively coupled to the system using a Small Computer System Interface (SCSI) bus, a Serial Attached SCSI (SAS) bus, a Serial Advanced Technology Attachment (SATA) bus, a Peripheral Component Interconnect Express (PCIe) bus, Fibre Channel, or some other similar interface or bus.

In some examples, storage devices may include processing systems capable of managing and monitoring the stored data as it is written to the storage media. In particular, the processing systems may be capable of identifying data to be written to the storage media, generating error correcting code (ECC) or parity data for the data to be written, and writing the data with the ECC data to the storage media. This ECC information may then be used by the storage system, when a read request is received, to help ensure that the correct data is provided to the processing system by applying the ECC data to the data and correcting any errors within the sectors. However, storage devices may be limited in the number of sectors that they can correct for the host processing system.

Further, in some implementations, Write Verify Functions may be used by host processing system with respect to storage devices to ensure that proper data is written to the storage media. This function permits a read command to be executed immediately after a write command to ensure that the data has been written properly to the storage media. However, this additional read command can cause a loss of performance in the hard drive, as each read takes resources that could be dedicated to other read and write operations on the device.

OVERVIEW

Examples disclosed herein provide enhancements for using error correcting code (ECC) data in writing and reading data to and from a data storage device. In one implementation, a computing apparatus includes one or more computer readable storage media and a processing system operatively coupled with the one or more computer readable storage media. The computing apparatus further includes program instructions stored on the one or more computer readable storage media to operate a host system to manage storage of data sets that, when read and executed by the processing system, direct the processing system to at least, in response to a read request for a data set, receive, from a data storage device, a first version of the data set, first error correcting code (ECC) parity data for the data set generated by the host system, and second ECC parity data generated by the data storage device for the data set, wherein the first ECC parity data and the second ECC parity data are generated using an encoder matrix. The program instructions further direct the processing system to at least process the first version of the data set using the first ECC parity data, the second ECC parity data, and the encoder matrix to generate a second version of the data set with one or more sector errors corrected from the first version of the data set.

In at least one implementations, the program instructions may further direct the processing system to, in response to a write request for the data set, generate the first ECC parity data for the data set using the encoder matrix, and transfer the data set and the first ECC parity data to the data storage device for storage by the data storage device.

BRIEF DESCRIPTION OF THE DRAWINGS

The following description and associated figures teach the best mode of the invention. For the purpose of teaching inventive principles, some conventional aspects of the best mode may be simplified or omitted. The following claims specify the scope of the invention. Note that some aspects of the best mode may not fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only to the claims and their equivalents.

FIG. 1 illustrates a system to link error correcting code of a host system and error correcting code of a data storage device according to one implementation.

FIGS. 4A and 4B illustrate operational scenarios of writing and reading data to and from a storage system according to one implementation.

DETAILED DESCRIPTION

Figure 3:
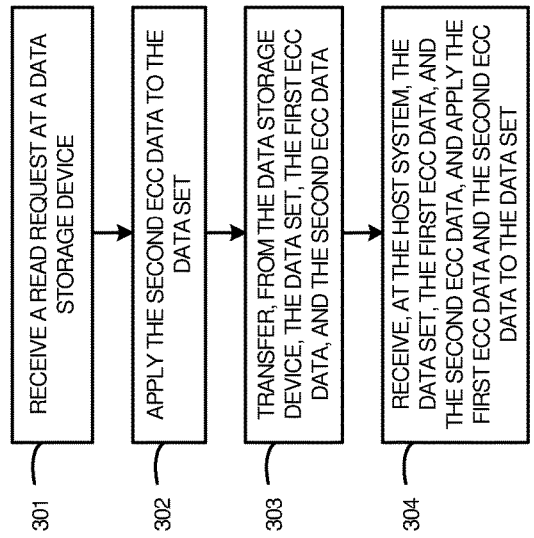
FIG. 3 illustrates a method of reading a data set from a storage device according to one implementation.

Storage devices, such as hard disk drives and solid state drives, are often used in computing systems to store data objects for a host processing system. These data objects often include audio files, video files, word documents, spreadsheets, images, or any other type of file. To make a storage device available to the host processing system, the storage device must be communicatively linked to a host processing system to enable communications between the two systems. This communication link may include a Small Computer System Interface (SCSI) bus, a Serial Attached SCSI (SAS) bus, a Serial Advanced Technology Attachment (SATA) bus, a Peripheral Component Interconnect Express (PCIe) bus, Fibre Channel, or some other similar interface or bus.

In the present example, host systems and data storage devices use error correcting code (ECC) to help ensure that data written to storage media on the data storage device accurately reflects the data that was requested to be stored. In particular, the ECC data is used to correct any bits and sectors that may have been incorrectly written to storage media of the data storage device. To more efficiently use the ECC parity data, ECC parity data generated by the host system is linked to the ECC parity data generated by the data storage device. In generating this link, a host system may use ECC parity data generated by the storage device in conjunction with ECC parity data generated by the host system to fix any issues in data stored on the storage media.

In some implementations, to link the ECC parity data for the storage device and the host system, the host system may, when a write is required for a data set, generate first ECC parity data for the data set. Once generated, the data set and the first ECC parity data may be provided to the storage device, wherein the storage device generates second ECC parity data for the data set. In some examples, the second ECC parity data may be generated for each of the required storage tracks for the data set. As the second ECC parity data is generated, the data set, the first ECC parity data, and the second ECC parity data may be stored to the storage media corresponding to the data storage device.

Once stored, the host system may generate a read request to retrieve the data set from the storage media. In response to the request, the storage device will apply the second ECC parity data to the data set to correct errors found within the data set. For example, if the second ECC parity were four sectors in length for each track, then the second ECC parity data may be used to repair four or fewer sectors on that particular track. However, if the error sectors are greater than four, then the track ECC parity generated by the storage device may be incapable of correcting the sectors without assistance from the host system parity data. After being applied, the data set may be provided along with the first ECC parity data and at least a portion of the second ECC parity data to the host system. The host system may then use an encoder matrix (used in the generation of the first ECC parity data and the second ECC parity data), the first ECC parity data, and the second ECC parity data from the data storage device to correct remaining errors in the data set. In some examples, the matrix may comprise a Cauchy Matrix or other matrix capable of generating parity data when applied to a data set.

To further demonstrate the linking of ECC parity data between a data storage device and a host system, FIG. 1 is provided. FIG. 1 illustrates a system 100 to link error correcting code of a host system and error correcting code of a data storage device according to one implementation. System 100 includes data storage device 110 and host system 120. Data storage device 110 further includes storage control system 111 and storage media 113, which may include hard disk storage, such as shingled magnetic recording (SMR) media. Data storage device 110 is communicatively coupled to host system 120 via bus 130.

In operation, data storage device 110 can store computer-readable data for later retrieval, such as user data, system data, swap file data, and the like. Host system 120 can control at least data storage and retrieval operations of data storage device 110 over bus 130, as well as control the transfer of data to other systems and equipment, such as processing systems, network interfaces, and the like. Host system 120 may include a central processing unit (CPU), as well as other computer hardware capable of managing data interactions with data storage device 110 as well as other similar systems.

As discussed above, when a write of a data set, such as a data object, file, or any other similar data set is required, host system 120 may generate ECC parity data for the data set using an encoder matrix before transferring the data set and the ECC parity data over bus 130 to data storage device 110. Data storage device 110 may, as the data is received from host system 120, generate second ECC parity data using the encoder matrix, wherein the second ECC parity data corresponds to the tracks required to store the data set and the first ECC parity data from host system 120. The data set may then be stored to storage media 113 with the ECC data generated by data storage device 110 and host system 120. Once written, the data set may then be read from storage media 113 using the operations further described herein.

Figure 2:
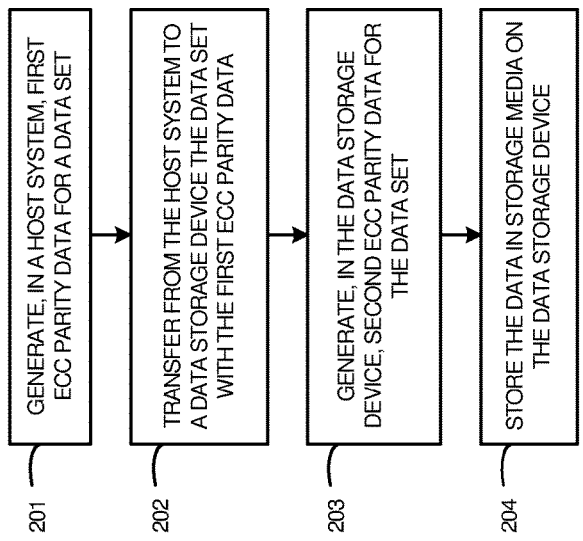
FIG. 2 illustrates a method of storing a data set in a storage device according to one implementation.

FIG. 2 illustrates a method of storing a data set in a storage device according to one implementation. The operations of FIG. 2 are referenced parenthetically below with reference to systems and elements of system 100 of FIG. 1.

In FIG. 2, in response to a write requirement for host system 120, host system 120 generates first ECC parity data for a data set using an encoder matrix, such as Cauchy matrix (201). This ECC data may include one or more sectors of data capable of correcting errors in the data set when the data set is written to storage media. Once the first ECC parity is generated, host system 120 may transfer the data set with the first ECC parity data to an appropriate data storage device 110 for the data set (202).

In response to receiving the data set with the first ECC parity data, data storage device 110 may generate second ECC parity data for the data set (203). In some implementations, the second ECC parity data corresponds to parity data for tracks used in writing the data set to the storage media. For example, if the data set used sectors on four tracks, then the second ECC parity data may include parity data for each of the four tracks. As the second ECC parity data is generated, the method further includes data storage device 110 storing the data in storage media 113 on data storage device 110 (204). This configuration also permits the write to storage media 113 to be accomplished without using a write verify function to ensure that the data was properly written to the storage media.

FIG. 3 illustrates a method of reading a data set from a storage device according to one implementation. The operations of FIG. 3 are referenced parenthetically below with reference to systems and elements of system 100 of FIG. 1.

Once data is written to storage media 113, host system 120 may require a read operation to retrieve data from storage media 113. To provide this operation, data storage device 110 and storage control system 111 receive a read request from host system 120 (301). In response to the request, data storage device 110 identifies the required data for the request and applies the second ECC parity data (corresponding to the ECC data generated by the storage device) to the data set (302). In some implementations, this ECC data may include track parity data for the requested data set generated by the host system. For example, if the second ECC parity were four sectors in length for each track, then the second ECC parity data may be used to repair four or fewer sectors on that particular track. However, if the error sectors are greater than four, then the track ECC parity data generated by the storage device may be incapable of correcting the sectors without assistance from the host system parity data.

Once error sectors are corrected in the requested data set using the track parity data, the data set with the corrected sectors, the first ECC parity data, and the second ECC parity data are transferred over bus 130 to host system 120 (303). This transfer permits host system 120 to use the ECC data generated by itself when storing the data, as well as the ECC data generated by the storage device when storing the data to correct any remaining errors in the requested data set.

Here, host system 120 is directed to receive the data set, the first ECC parity data (corresponding to error correction data from the host system), and the second ECC parity data (corresponding to error correction data from the storage device) (304). Once received, host system 120 may apply the first ECC parity data and the second ECC parity data in conjunction with an encoder matrix to correct any remaining errors corresponding to the data set.

In some implementations, rather than providing the first ECC parity data with the second ECC parity data for each of the data reads, the storage device may provide the second parity data only when they are required. For example, the storage device may determine whether any error sectors can be corrected before providing the sectors to host system 120. If it is determined that all of the sectors can be corrected prior to transferring the data to host system 120, data storage device 110 may be required to transfer only the data and, in some examples, the parity data generated by host system 120 for the read request. In contrast, if the sectors cannot all be fixed using the parity generated by storage control system 111 on data storage device 110, then data storage device 110 may provide the parity data generated by the storage device with the data set and ECC parity data generated by the host.

FIGS. 4A and 4B illustrate operational scenarios 400 and 401 of writing and reading data to and from a storage system according to one implementation. FIGS. 4A and 4B include host system 410 and storage system 440, wherein host system 410 is communicatively coupled to storage system 440 in a similar manner as system 100 of FIG. 1.

Referring first to operational scenario 400 of FIG. 4A, at step 1, host system 410 generates ECC parity A data 430 for data set 420 to be written to storage system 440. Parity A data 430 may include one or more sectors of parity information corresponding to the entirety of data set 420 and may be generated using an encoder matrix, such as a Cauchy matrix. Once the parity data is generated for the data set by host system 410, data set 420 and parity A data 430 may be transferred, at step 2, to storage system 440. Storage system 440 then generates, at step 3, parity B data 431 corresponding to track error correcting information for data set 420 as it is written to the storage media of storage system 440. For example, for each track required by data set 420, storage system 440 may write one or more sectors to correct any errors in that track. Additionally, parity A data 430 may be written to the storage media with data set 420 and parity B data 431.

Turning to FIG. 4B, operational scenario 401 describes the operations of a data read after the writing of data set 420 and parity data 430-431 to storage system 440. In particular, storage system 440 receives a read request from host system 410 and applies, at step 4, parity B data 431 to correct any errors identified within data set 420. For example, if an error were found in a first sector of a first track, then the corresponding parity B data 431 for the first track may be used to correct the error. Once the parity B data 431 is applied to data set 420, storage system 440 may transfer, at step 5, data set 440 and parity data 430-431 to host system 410.

In some implementations, where parity B data 431 is capable of correcting all errors within data set 420, then data set 420 and, in some examples, parity A data 430 may be provided to host system 410 without parity B data 431, since the data is not required to correct errors in the data set. In contrast, if parity B data 431 is not capable of fixing the errors within data set 420, then both parity data A and B will be required by host system 410 to fix the remaining errors.

Here, once data set 420 and parity data 430-431 are received by host system 410, host system 410 may apply, at step 6, parity A data 430 and parity B data 431 to correct remaining errors in the data set. In some implementations, in applying parity data 430 and 431 to the data set, host system 410 may use the parity data in conjunction with the encoder matrix that was used to generate the parity data. This encoder matrix may comprise a Cauchy matrix in some instances, an example of which can be found in FIG. 6. In particular, host system 410 may perform mathematical operations on the data set using parity data 430-431 and the encoder matrix to identify recovered data sectors.

In some implementations, the version of data set 420 that is provided to host system 410 in operational scenario 401 may include the errors that could not be fixed using parity B data 431. In other examples, storage system 440 may replace the error sectors with zeros, such that the errors may be readily identifiable and correctable for host system 410.

Although described in the previous examples of FIGS. 1-4B as storing the host system ECC data with the data set on the storage device, it should be understood that the host system ECC data may be stored in other locations. For example, the host system ECC data may be stored at a separate location on the data storage device or may be stored on a secondary storage device. Thus, when the host system ECC data is required to correct errors in a data set, the host system ECC data may be retrieved from the separate location on the data storage device or from the secondary storage device.

Figure 5:
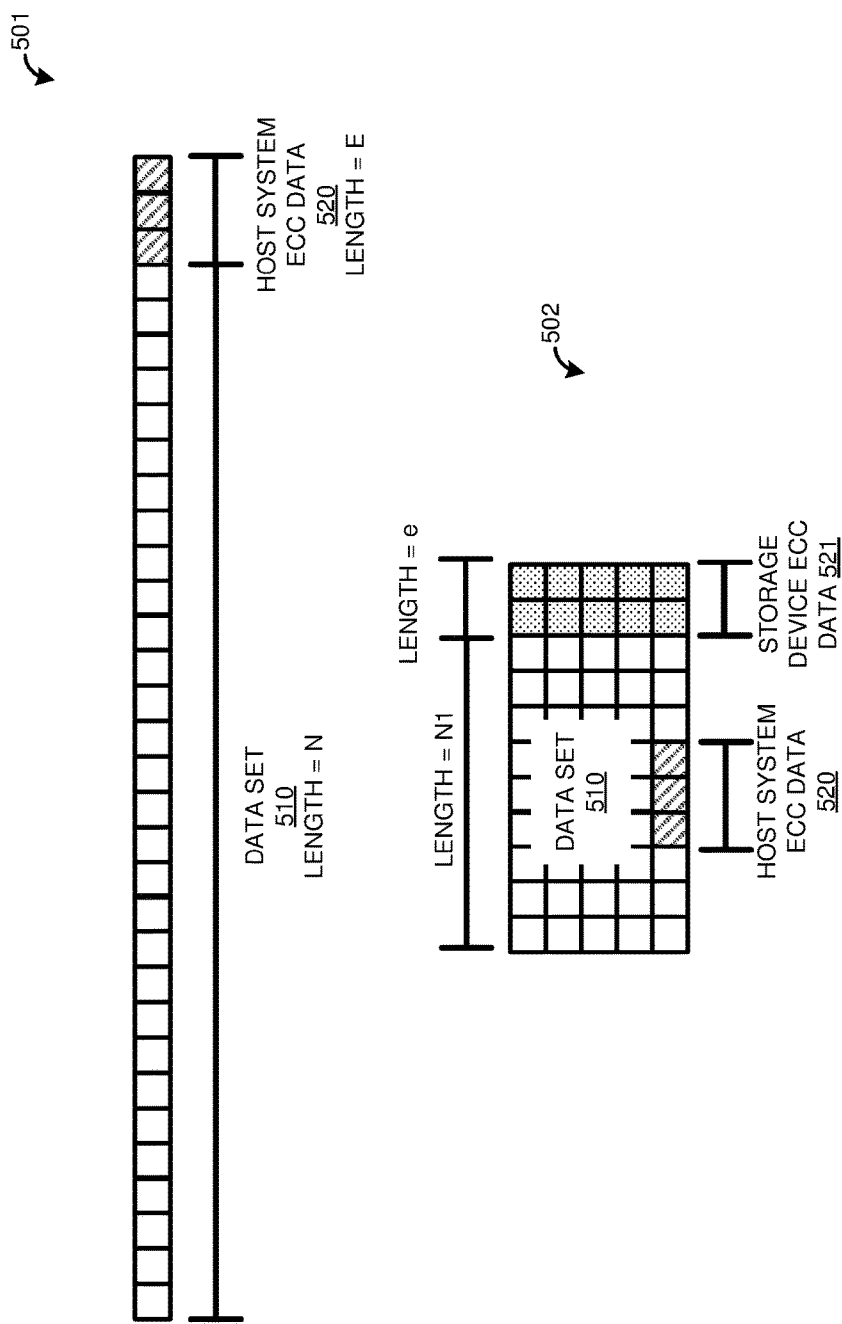
FIG. 5 illustrates overviews of generating error correcting code according to one implementation.

FIG. 5 illustrates overviews of generating error correcting code according to one implementation. Operational scenarios 501 and 502 include data set 510, host system ECC data 520, and storage device ECC data 521.

In operation, a host may generate a write command to write data set 510 to storage media provided by a storage device. To write the data, the host system may generate host system ECC data 520 of length E corresponding to the parity of data set 510. In a non-limiting example, the host system may use a portion of a Cauchy matrix to generate the host system ECC data and multiply data set 510 by the transpose of the host system portion of the Cauchy matrix to determine host system ECC data 520. The equation for such an operation may appear as follows $$D[1 \times 1:N] \times \text{transpose of } C[e+1:e+E \times 1:N]$$

where C represents the portion of the Cauchy matrix for the host system, D represents the data matrix (data set), N is the number of sectors in the data set, and e represents the storage system parity number for each track. Once the host system ECC data is generated, data set 510 and host system ECC data 520 may be provided to the data storage device.

Turning to operational scenario 502, once the data is received from the host system, the data storage device may generate track ECC data for the data represented in FIG. 5 as storage device ECC data 521. Storage device ECC data 521 may then be stored with data set 510 and host system ECC data 520 on storage media of the storage device. In some implementations, in generating storage device ECC data 521, the storage device may identify a portion of the Cauchy matrix corresponding to the data storage device and apply that to data set 510 to generate storage device ECC data 521. For example, for the first track of operational scenario 502, a portion of the data matrix $$D1[1 \times 1:N1]$$

may be multiplied by the transpose of the Cauchy matrix portion corresponding to the first track, $C[1:e\times1:N1]$, wherein e is the number of sectors for each track and N1 is the length of data from the host that can be written to each track.

Figure 6:
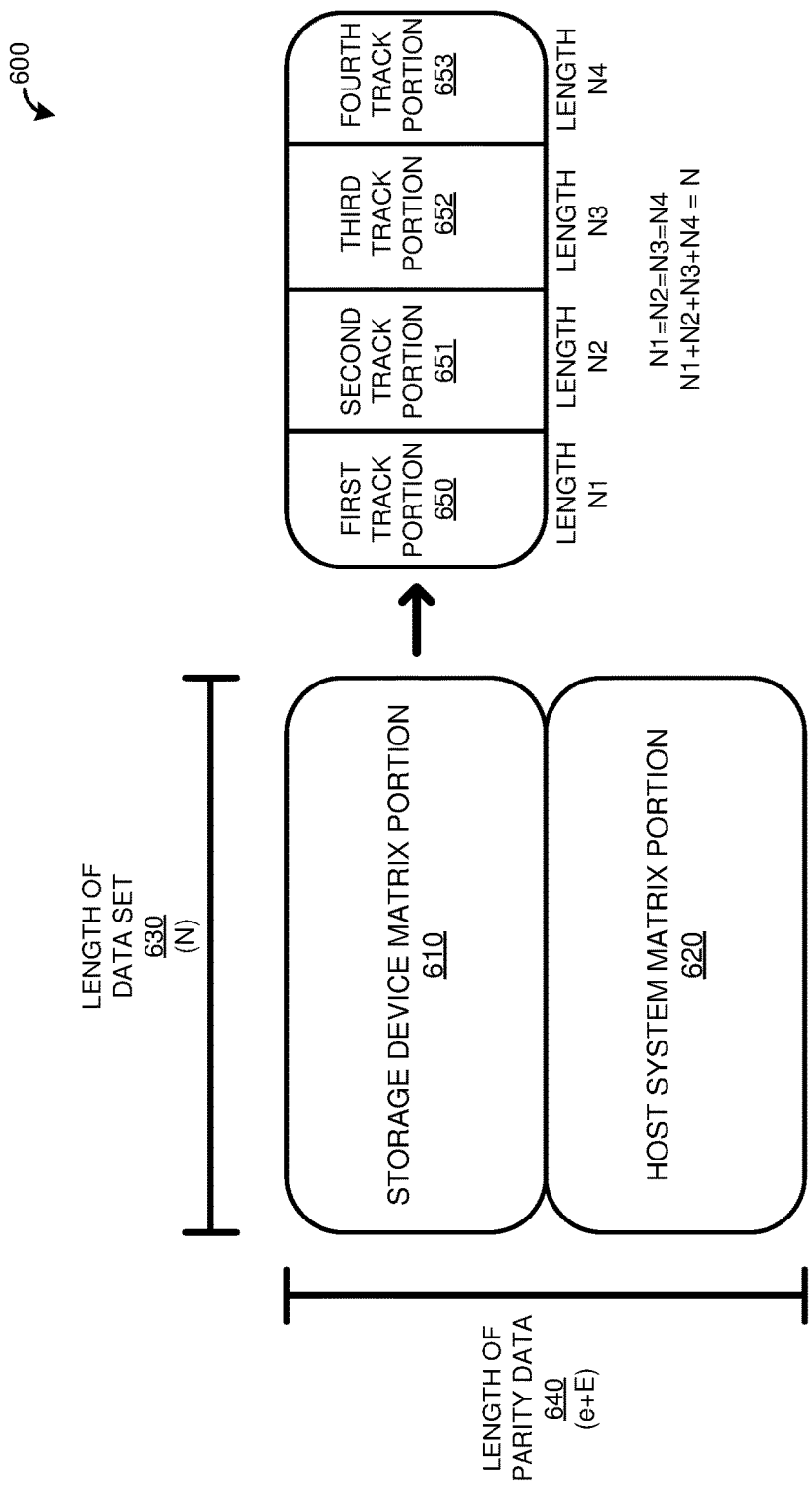
FIG. 6 illustrates a matrix to generate host system error correcting code data and storage device error correcting code data according to one implementation.

FIG. 6 illustrates a matrix 600 to generate host system ECC data and storage device ECC data according to one implementation. Matrix 600 is representative of a Cauchy Matrix, such as that described in FIG. 5. Matrix 600 includes storage device matrix portion 610 and host system matrix portion 620. Matrix 600 is defined by the length of parity data 640 (e+E) and by the length of the data set 630 (N), or C is [1:e+E×1:N]. In the example of matrix 600, e represents the number of parity sectors for each track, E represents the number of system parity sectors for the data set, and N is the overall length of the data set, which is made up of sector lengths N1, N2, N3, and N4.

Here, the first portion of the matrix comprises a storage device matrix portion 610, which can further be broken into smaller track portions 650-653. These portions are representative of portions of the matrix to generate ECC parity data for each track in the storage system. For example, first track portion 650 may correspond to the portion that is used in generating the parity for the first track for a data set. To generate the ECC parity data for the first track, the portion of the data set in the first track may be multiplied by the transpose of first track portion 650. The ECC parity data for the first track may then be stored on the storage media with the first track. Similar operations may also be used in generating the parity data for the remaining tracks for the data set using track portions 651-653.

In addition to generating the ECC parity data for each of the individual tracks, matrix 600 is also used in generating system ECC parity data generated by the host system. Here, host system matrix portion 620 is used in conjunction with the data set to generate first parity data for the data set. In particular, the host system may multiply the data set by the transpose of host system matrix portion 620 to generate the system ECC parity data. This parity data may then be provided with the data set to the storage device, permitting the storage device to store the system ECC parity data with the data set.

Once the data is written to the storage media of the data storage device, the host system may then require that the data be read from the storage media. To provide this operation, the storage device may first apply the storage device ECC parity data to the data set to correct any identifiable errors. In some implementations, if the device ECC parity data can correct all of the errors, then the system ECC parity data may not be required. However, if the device ECC parity data is incapable of correcting all of the errors, then the system ECC parity data and the storage device ECC parity data may be provided with the data set, wherein the data set will include error sectors. These error sectors may be allocated zeros by the data storage device in some implementations or may be provided with the errors by the data storage device to the host system. In some examples, the data storage device may further provide a list of the sectors that have remaining errors for the host system.

Once the first version of the data set is provided (with the included error sectors) along with the device and system ECC parity data, the host system may process the first version of the data set using the ECC parity data and matrix 600 to fix the remaining errors in the data set. In at least one implementation, the host system may multiply the first version of the data set (with the errors) by the transpose of matrix 600 to generate a system ECC modified parity matrix PE'. The equation would appear as follows $$D'[1\times1:N]\times\text{transpose of } C[1: e+E\times1:N]=PE'[1\times1:e+E],$$

where D' represents the data of the first version of the data set with errors.

The host system may further generate a storage device integrated parity matrix for the first version of the data set, wherein the integrated parity matrix may be accomplished using multiple methods. First, referring to FIG. 6 as an example, if an error sector were identified in the second track, the host system would multiply portions of the data set corresponding to the first track, the third track, and the fourth track by the transverse of track portions 650 and 652-653 to generate a storage device ECC modified parity matrix. The equation would appear as follows $$D'[1\times1:N1,2*N1+1:4*N1]\times\text{transpose of } C[1\times1:N1, 2*N1+1:4*N1]=Pe'.$$

Once multiplied, the ECC parity data corresponding to the second track may be added to the storage device ECC modified parity matrix to generate the storage device ECC integrated parity matrix Pe". This equation would appear as follows $$Pe2:[1\times1:e]+Pe'[1\times1:e]=Pe"[1\times1:e].$$

After generating the storage device ECC integrated parity matrix Pe", the storage device ECC integrated parity matrix may be concatenated with the system ECC parity matrix such that Pe"[1×1:e] is concatenated with system ECC parity matrix PE [1×1:E] to create matrix PE"[1×1: e+E]. matrix PE" is then added to system ECC modified parity matrix PE' to generate integrated syndrome matrix PE''', wherein PE" [1×1: e+E]+PE'[1×1: e+E]=PE'''[1×1: e+E].

Once the integrated syndrome matrix PE''' is generated, the column in matrix 600 corresponding to the error sector is identified, such that a partial matrix C [1:e+E×1:e+E] is identified for the error. Referring back to the example of an error in second track portion 651, a column would be identified that corresponds to the second track. An inverse is then taken of the partial matrix and is multiplied by the transpose of the integrated syndrome matrix, such that inverse of C [1:e+E×1:e+E] X transpose of PE'''[1×1: e+E] =recovered data sectors vector R [e+E×1].

This recovered sectors vector is then used to generate a second version of a data set with the required corrected sectors.

Turning to FIGS. 7A-7D as another example of determining recovered data sectors to generate a corrected data set. FIG. 7A-7D illustrate an overview of identifying recovered data sectors according to one implementation.

Figure 7A:
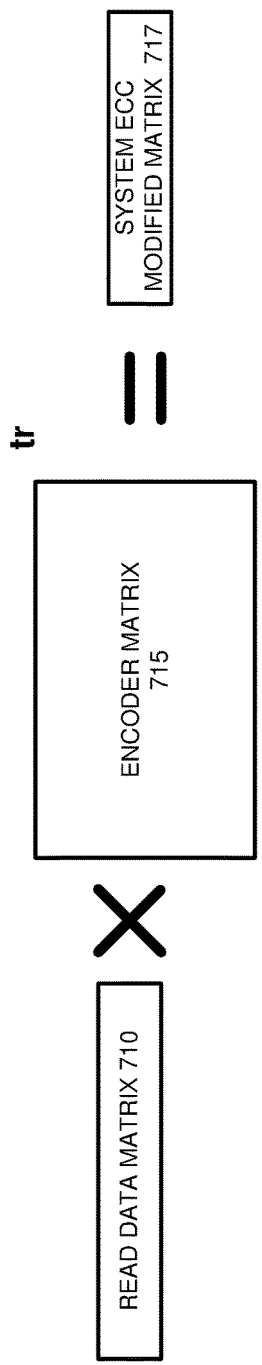
FIGS. 7A-7D illustrate an overview of identifying recovered data sectors according to one implementation.

Referring first to FIG. 7A, the operation includes multiplying read data matrix 710 corresponding to data read from the storage device by the transverse ("tr") of encoder matrix 715 to generate system ECC modified parity matrix 717. In particular, read data matrix 710 may include a first version of the data set read by the data storage device, wherein any sectors that could not be corrected by the storage device ECC parity data may be provided as zeros in some examples, and further may be provided to the host system with information about the sectors that were incapable of being corrected by the data storage device.

Figure 7B:
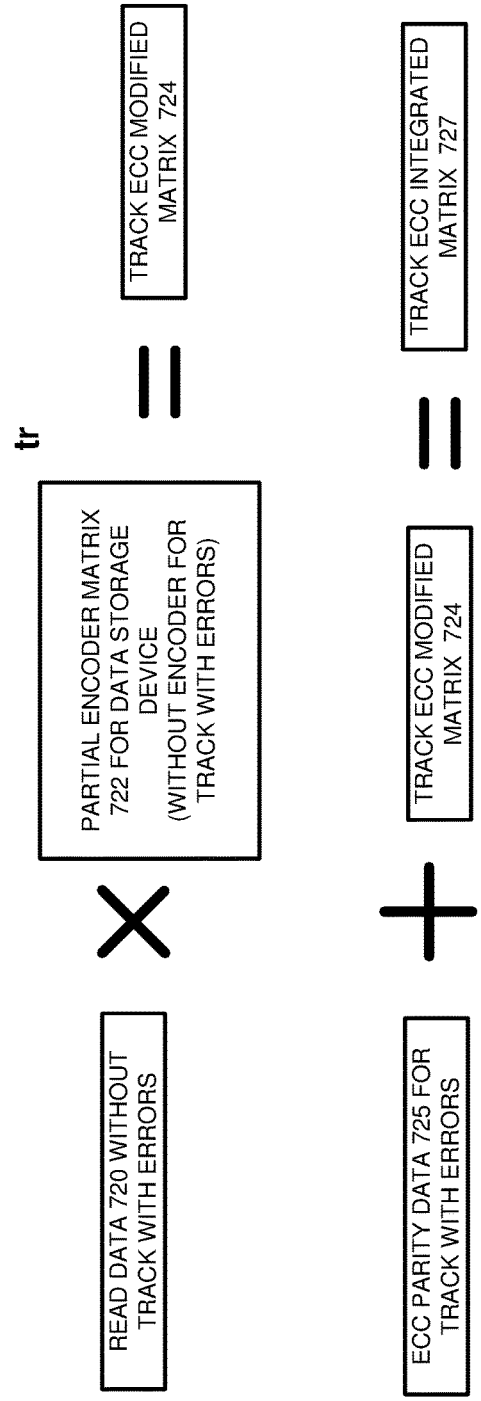

In addition to the operations of FIG. 7A, FIG. 7B illustrates a determination of a track ECC integrated matrix 727. To generate this matrix for correcting data sets, the present example provides that read data 720 without any track errors is multiplied by the transverse of partial encoder matrix 722 used for generating parity data for the data storage device, wherein the partial encoder matrix does not include the portions of encoder matrix 715 that were used to generate parity data for tracks with errors. Once multiplied, this function generates track ECC modified matrix 724. For example, if a second track of a four track data read included the errors, then the read data 720 would include data from tracks one, three, and four. Similarly, only portions of the matrix that were used to generate parity for track one, three, and four at the data storage device would be used for partial encoder matrix 722. Once the track ECC modified matrix 724 is generated, it is then added to the ECC parity data 725 for a track with errors to generate track ECC integrated matrix 727. Thus, returning to the example issue with the second track, ECC parity data 725 would correspond to the parity data for the second track.

Although this is one example of generating track ECC integrated matrix 727, it should be understood that other methods may also be applied. In at least one implementation, when a data read does not require an entire track, such as when read data uses all of three tracks and a portion of a fourth track, track ECC modified matrix may be generated as follows. First, the storage device ECC parity data for each of the complete tracks may be summed together. Referring to the example of three complete tracks for a data read, the storage device ECC parity data for each of those tracks may be summed together. Second, the partial read data corresponding to the partial track (in this example, the fourth track) may be multiplied by a portion of the encoder matrix. In particular, this portion corresponds to the encoder matrix that would be used to generate storage device ECC parity data for the data of the partial track. Once multiplied, the result may be added to the sum generated for the complete tracks ECC parity data to generate the track ECC integrated matrix 727.

Although described in the previous example as reading a partial track for part of a data set read request, it should be understood that similar operations may be applied when the read request is for complete tracks. Further, in some implementations, at least a portion of the data operations with respect to the storage device ECC parity data may be provided by the storage device, and the track ECC integrated matrix 727 may be provided to the host system. Accordingly, rather than providing the ECC parity data that was stored on the disk, the track ECC integrated matrix may be provided to the host system as the ECC parity data. In an alternative implementation, at least a portion of the ECC integrated matrix may be provided to the host system. Once provided, the host system may provide the operations with respect to a portion of the ECC integrated matrix.

Figure 7C:
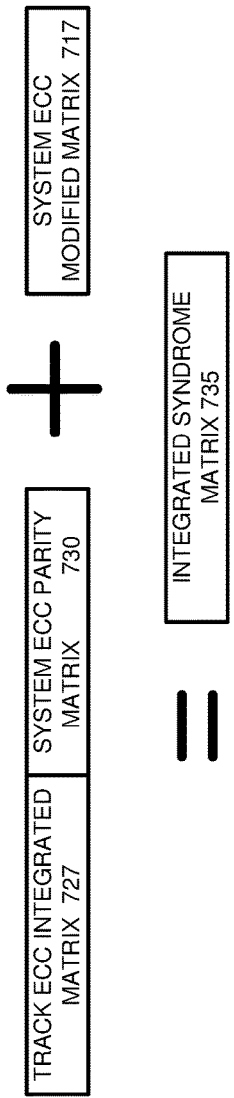

Turning to FIG. 7C, once the track ECC integrated matrix 727 is generated, it may be concatenated with a system ECC parity matrix 730, wherein ECC parity matrix 730 is representative of the error correcting data generated by the host system for the complete data set. This concatenated matrix is then added to system ECC modified matrix 717 generated in FIG. 7A to create integrated syndrome matrix 735.

Figure 7D:
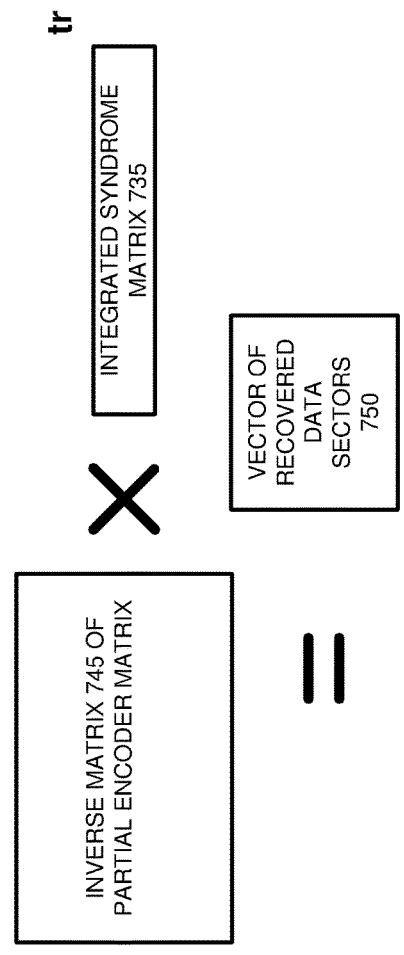

Referring to FIG. 7D, the operations further include identifying a column in encoder matrix 715 corresponding to the track errors in the requested data set. The inverse matrix 745 of the column from encoder matrix 715 is then multiplied by the transverse of integrated syndrome matrix 735 to generate a vector of recovered data sectors 750. This vector may then be used to provide a corrected version of the requested data set.

Figure 8:
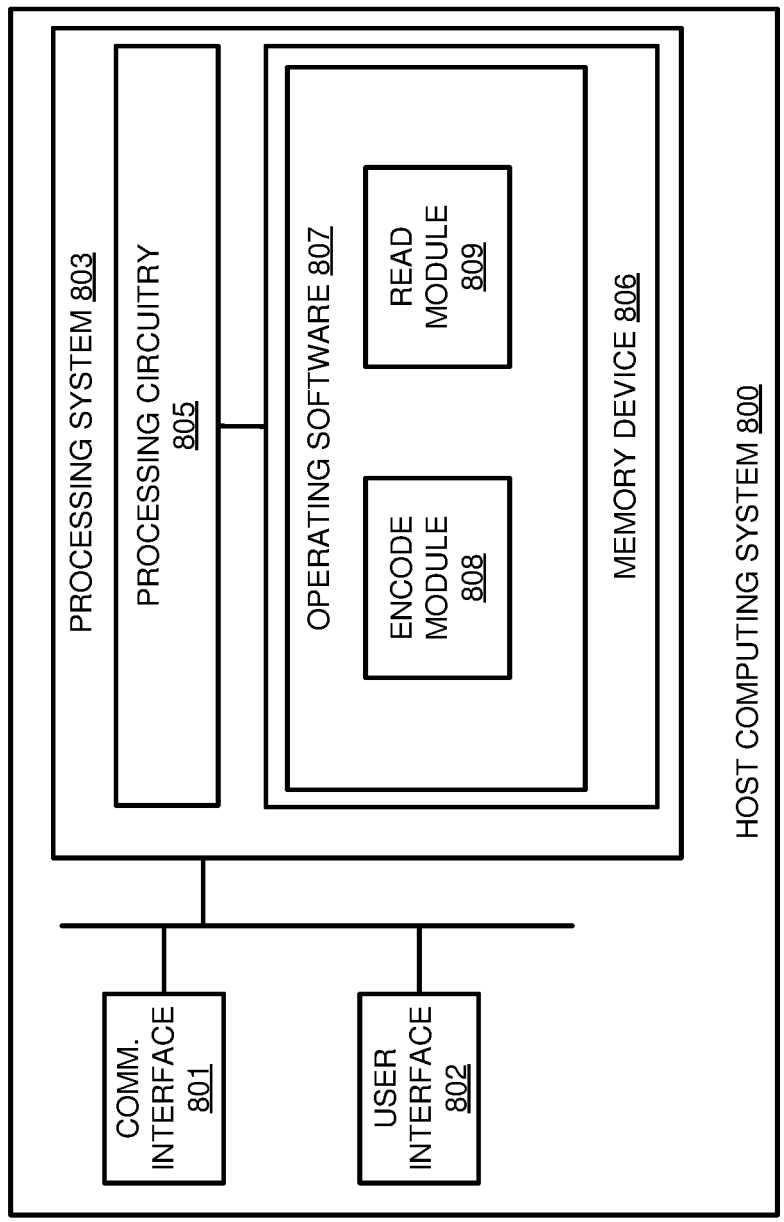
FIG. 8 illustrates a host computing system according to one implementation.

FIG. 8 illustrates a host computing system 800 according to one implementation. Host computing system 800 is representative of any computing system or systems with which the various operational architectures, processes, scenarios, and sequences disclosed herein for ECC parity operations may be implemented. Host computing system 800 is an example of host systems 120 and 410, although other examples may exist. Host computing system 800 comprises communication interface 801, user interface 802, and processing system 803. Processing system 803 is linked to communication interface 801 and user interface 802. Processing system 803 includes processing circuitry 805 and memory device 806 that stores operating software 807. Host computing system 800 may include other well-known components such as a battery and enclosure that are not shown for clarity.

Communication interface 801 comprises components that communicate over communication links, such as network cards, ports, radio frequency (RF), processing circuitry and software, or some other communication devices. Communication interface 801 may be configured to communicate over metallic, wireless, or optical links. Communication interface 801 may be configured to use Time Division Multiplex (TDM), Internet Protocol (IP), Ethernet, optical networking, wireless protocols, communication signaling, or some other communication format—including combinations thereof. Communication interface 801 may further include one or more interfaces for communicating with communication networks, storage data buses, storage data links, or other devices. The interfaces can include any serial or parallel digital interfaces, or other communication and data interfaces, including combinations, variations, and improvements thereof. Examples of communication interface 801 include logic, transmission gates, buffers, network interface card equipment, transceivers, and other communication circuitry. In this example, communication interface 801 may be used to communicate with data storage device 900 further described in FIG. 9.

User interface 802 comprises components that interact with a user to receive user inputs and to present media and/or information. User interface 802 may include a speaker, microphone, buttons, lights, display screen, touch screen, touch pad, scroll wheel, communication port, or some other user input/output apparatus—including combinations thereof. User interface 802 may be omitted in some examples.

Processing circuitry 805 comprises microprocessor and other circuitry that retrieves and executes operating software 807 from memory device 806. Memory device 806 may include volatile and nonvolatile, removable and non-removable media implemented in any method or technology for storage of information, such as computer readable instructions, data structures, program modules, or other data. Memory device 806 may be implemented as a single storage device, but may also be implemented across multiple storage devices or sub-systems. Memory device 806 may comprise additional elements, such as a controller to read operating software 807. Examples of storage media include random access memory, read only memory, magnetic disks, optical disks, and flash memory, as well as any combination or variation thereof, or any other type of storage media. In some implementations, the storage media may be non-transitory storage media. In some instances, at least a portion of the storage media may be transitory. It should be understood that in no case is the storage media a propagated signal.

Processing circuitry 805 is typically mounted on a circuit board that may also hold memory device 806 and portions of communication interface 801 and user interface 802.

Operating software 807 comprises computer programs, firmware, or some other form of machine-readable program instructions. Operating software 807 includes encode module 808 and read module 809, although any number of software modules within the application may provide the same operation. Operating software 807 may further include an operating system, utilities, drivers, network interfaces, applications, or some other type of software. When executed by processing circuitry 805, operating software 807 directs processing system 803 to operate host computing system 800 as described herein.

In one implementation, encode module 808 (when read and executed by processing system 803) identifies a request to store a data set to a data storage device. In response to the request, encode module 808 generates first ECC parity data using an encoding matrix (such as a Cauchy matrix) and transfers the data set and the first ECC parity data to the data storage device using communication interface 801.

Once the data is stored in the data storage device, read module 809 directs processing system 803 to request and receive a first version of the data set from the data storage device, along with the first ECC parity data and second ECC parity data corresponding to track parity data on the data storage device, wherein the second ECC parity data is generated using the same encoding matrix as the first ECC parity data. After the data is received, using communication interface 801, read module 809 directs processing system 803 to process the first version of the data set using the first ECC parity data, the second ECC parity data, and the encoder matrix to generate a second version of the data set with one or more errors corrected from the first version of the data set.

Figure 9:
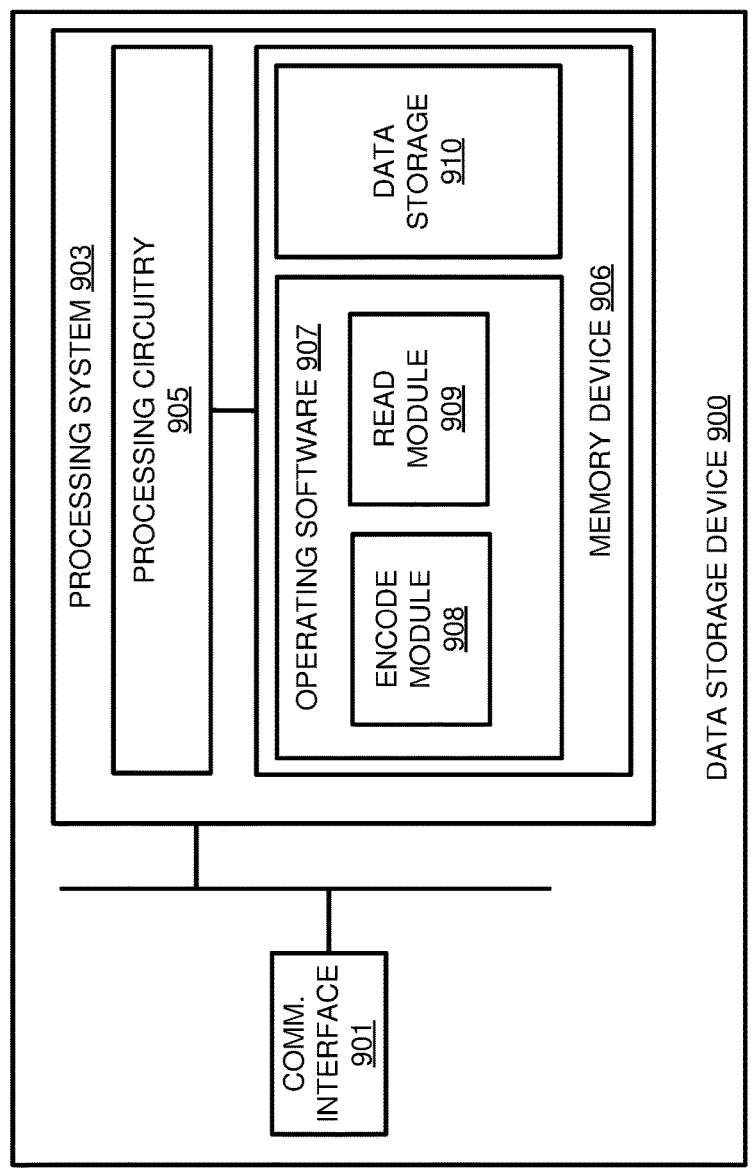
FIG. 9 illustrates a data storage device according to one implementation.

FIG. 9 illustrates a data storage device 900 according to one implementation. Data storage device 900 is representative of any computing system or systems with which the various operational architectures, processes, scenarios, and sequences disclosed herein for ECC parity operations of a data storage device may be implemented. Data storage device 900 is an example of data storage device 110 and storage system 440, although other examples may exist as described herein. Data storage device 900 comprises communication interface 901 and processing system 903. Processing system 903 is linked to communication interface 901. Processing system 903 includes processing circuitry 905 and memory device 906 that stores operating software 907 and data storage 910. Data storage device 900 may include other well-known components such as a battery and enclosure that are not shown for clarity.

Communication interface 901 comprises components that communicate over communication links, such as network cards, ports, radio frequency (RF), processing circuitry and software, or some other communication devices. Communication interface 901 may be configured to communicate over metallic, wireless, or optical links. Communication interface 901 may be configured to use Time Division Multiplex (TDM), Internet Protocol (IP), Ethernet, optical networking, wireless protocols, communication signaling, or some other communication format—including combinations thereof. Communication interface 901 may further include one or more interfaces for communicating with communication networks, storage data buses, storage data links, or other devices. The interfaces can include any serial or parallel digital interfaces, or other communication and data interfaces, including combinations, variations, and improvements thereof. Examples of communication interface 901 include logic, transmission gates, buffers, network interface card equipment, transceivers, and other communication circuitry. In this example, communication interface 901 may be used to communicate with a host system, such as host computing system 800 further described in FIG. 8.

Processing circuitry 905 comprises microprocessor and other circuitry that retrieves and executes operating software 907 from memory device 906 and retrieves data from data storage 910 in memory device 906. Memory device 906 may include volatile and nonvolatile, removable and non-removable media implemented in any method or technology for storage of information, such as computer readable instructions, data structures, program modules, or other data. Memory device 906 may be implemented as a single storage device, but may also be implemented across multiple storage devices or sub-systems. Memory device 906 may comprise additional elements, such as a controller to read operating software 907. Examples of storage media include random access memory, read only memory, magnetic disks, optical disks, and flash memory, as well as any combination or variation thereof, or any other type of storage media. In some implementations, the storage media may be non-transitory storage media. In some instances, at least a portion of the storage media may be transitory. It should be understood that in no case is the storage media a propagated signal.

Processing circuitry 905 is typically mounted on a circuit board that may also hold memory device 906 and portions of communication interface 901. Operating software 907 comprises computer programs, firmware, or some other form of machine-readable program instructions. Operating software 907 includes encode module 908 and read module 909, although any number of software modules within the application may provide the same operation. Operating software 907 may further include an operating system, utilities, drivers, network interfaces, applications, or some other type of software. Memory device 906 further includes data storage 910 capable of storing data objects or sets when they are provided by a host system. When executed by processing circuitry 905, operating software 907 directs processing system 903 to operate data storage device 900 as described herein.

In one implementation, encode module 908, when read and executed by processing system 903, directs processing system 903 to identify a write request for a data set or object from a host system (such as host computing system 800 of FIG. 8) and further directs processing system 903 to receive, via communication interface 901, the data set and first ECC parity data generated by the host system. Once received, encode module 908 directs processing system 903 to generate second ECC parity data for the data set using a portion of an encoding matrix that was used to generate the first ECC parity data. In particular, the second ECC parity data is used to provide error correction for each track that is required to write the data to data storage 910, which in some examples comprises a SMR disk. Once the second ECC parity data is generated, the data set, the first ECC parity data, and the second ECC parity data are written to data storage 910.

Once data is written to data storage 910, read module 909 (when read and executed by processing system 903) directs processing system 903 to identify a read request for the data set. In response to the request, read module 909 directs processing system 903 to apply the second ECC parity data for the data set to correct any errors in the sectors for the data set. After the second ECC parity data is applied to the data set, the data set is then transferred using communication interface 901 to a host system along with the first ECC parity data and the second ECC parity data. In some implementations, only a portion of the second ECC parity data is required by the host system. For example, if the first track is the only track with sector errors, then the second ECC parity data associated with the first track may be the only portion of the second ECC parity data provided to the host system, as that is all that is required for the error correction at the host system. In other examples, a summary may be provided to the host system, wherein the summary includes a summation of the second ECC data for one or more tracks. For example, if a data set were written on three full tracks and one partial track, data storage device 900 may sum the second ECC data for the first three tracks and provide the summary to the host system for error correction.

In some implementations, data storage device 900 may determine whether there are any remaining sector errors after applying the second ECC parity data. If there are no remaining sector errors, then data storage device 900 may provide the requested data set without any of the second ECC parity data as it is not required. In contrast, if errors still exist within the data set, then at least a portion of the ECC parity data may be provided to the host system to be corrected as described herein.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A computing apparatus comprising:
    one or more non-transitory computer readable storage media;
    a processing system operatively coupled with the one or more non-transitory computer readable storage media; and
    program instructions stored on the one or more non-transitory computer readable storage media to operate a host system to manage storage of data sets that, when read and executed by the processing system, direct the processing system to at least:
        in response to a read request, receive, from a data storage device, a first version of a data set, first error correcting code (ECC) parity data for the data set generated by the host system using an encoder matrix, and second ECC parity data for the data set generated by the data storage device using the encoder matrix for tracks of storage media on the data storage device;
        generate a second version of the data set with one or more sector errors corrected from the first version of the data set by applying the first ECC parity data and the second ECC parity data to the first version of the data set in conjunction with the encoder matrix.

2. The computing apparatus of claim 1 wherein the program instructions further direct the processing system to:
    in response to a write request for the data set, generate the first ECC parity data for the data set using the encoder matrix; and
    transfer the data set and the first ECC parity data to the data storage device for storage by the data storage device.

3. The computing apparatus of claim 1 wherein the encoder matrix comprises a Cauchy Matrix.

4. The computing apparatus of claim 1 wherein the tracks correspond to storage locations for the data set.

5. The computing apparatus of claim 4 wherein each track of the tracks stores one or more sectors of the data set or the first ECC parity data.

6. The computing apparatus of claim 1 wherein the first version of the data set comprises errors uncorrectable using the second ECC parity data.

7. The computing apparatus of claim 1 wherein the program instructions further direct the processing system to receive, from the data storage device, an indication identifying at least one remaining sector with errors in the first version of the data set.

8. A computing system to manage data parity for data sets, the computing system comprising:
    a data storage device; and
    a host processing system communicatively coupled to the data storage device and configured to:
        in response to a read request, receive, from a data storage device, a first version of a data set, first error correcting code (ECC) parity data for the data set generated by the host system using an encoder matrix, and second ECC parity data for the data set generated by the data storage device using the encoder matrix for tracks of storage media on the data storage device using the encoder matrix; and
        generate a second version of the data set with one or more sector errors corrected from the first version of the data set by applying the first ECC parity data and the second ECC parity data to the first version of the data set in conjunction with the encoder matrix.

9. The computing system of claim 8 wherein the host processing system is further configured to:
    in response to a write request for the data set, generate the first ECC parity data for the data set; and
    transfer the data set and the first ECC parity data to the data storage device for storage by the data storage device.

10. The computing system of claim 9 wherein the data storage device is configured to:
    receive the data set and the first ECC parity data;
    generate the second ECC parity data for the data set; and
    store the data set, the first ECC parity data, and the second ECC parity data.

11. The computing system of claim 10 wherein the data storage device configured to store the data set, the first ECC parity data, and the second ECC parity data is configured to store the data set, the first ECC parity data, and the second ECC parity data to shingled magnetic recording media of the data storage device.

12. The computing system of claim 8 wherein the matrix comprises a Cauchy Matrix.

13. The computing system of claim 8 wherein the tracks correspond to storage locations for the data set.

14. The computing system of claim 13 wherein each track of the tracks stores one or more sectors of the data set or the first ECC parity data.

15. The computing system of claim 8 wherein the first version of the data set comprises errors uncorrectable using the second ECC parity data.

16. The computing system of claim 8 wherein the host processing system is further configured to receive, from the data storage device, an indication identifying at least one remaining sector with errors in the first version of the data set.

17. A computing apparatus comprising:
one or more non-transitory computer readable storage media;
a processing system operatively coupled with the one or more non-transitory computer readable storage media; and
program instructions stored on the one or more non-transitory computer readable storage media to operate a data storage device to manage storage of data sets that, when read and executed by the processing system, direct the processing system to at least:
in response to receiving a read request for a data set stored on a storage media of a data storage device, apply second error correcting code (ECC) parity data to the data set, wherein the second ECC parity data is generated by the data storage device for tracks on the data storage device using an encoder matrix;
determine whether the second ECC parity data corrected all sectors in the data set; and
when the second ECC parity data does not correct all sectors in the data set, transfer the data set, at least a portion of the second ECC parity data, and first ECC parity data to a host system, wherein the first ECC parity data was generated by the host system using the encoder matrix.

18. The computing apparatus of claim 17 wherein the program instructions further direct the processing system to, if the second ECC parity data did correct all sectors in the data set, transfer at least the data set to the host system.

19. The computing apparatus of claim 17 wherein the encoder matrix comprises a Cauchy Matrix.

20. The computing apparatus of claim 17 wherein the storage device comprises a hard disk drive.

21. A system comprising:
a means for identifying a read request for a data set stored on storage media of a data storage device;
a means for, in response to the read request, applying second parity data to the data set, wherein the second parity data is generated by the data storage device for tracks on the data storage device using an encoder matrix;
a means for determining whether the second parity data corrected all sectors in the data set; and
a means for, if the second parity data did not correct all sectors in the data set, transferring the data set, at least a portion of the second parity data, and first parity data to a host system, wherein the first parity data was generated by the host system using the encoder matrix.

22. The system of claim 21 further comprising:
a means for receiving, from the data storage device, the data set, the first parity data, and at least the portion of the second parity data;
a means for processing the data set using the first parity data, at least the portion of the second parity data, and the encoder matrix to generate a second version of the data set with one or more sector errors corrected from the data set.

* * * * *